United States Patent
Singer et al.

(10) Patent No.: US 7,362,414 B2
(45) Date of Patent: Apr. 22, 2008

(54) OPTICAL SYSTEM HAVING AN OPTICAL ELEMENT THAT CAN BE BROUGHT INTO AT LEAST TWO POSITIONS

(75) Inventors: Wolfgang Singer, Aalen (DE); Joachim Hainz, Aalen (DE); Joachim Wietzorrek, Aalen (DE); Markus Weiss, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/065,327

(22) Filed: Feb. 24, 2005

(65) Prior Publication Data
US 2006/0001854 A1 Jan. 5, 2006

Related U.S. Application Data

(63) Continuation of application No. PCT/EP03/05387, filed on May 23, 2003.

(30) Foreign Application Priority Data
Aug. 27, 2002 (DE) ............................... 102 40 002

(51) Int. Cl.
  G03B 27/52 (2006.01)
  G03B 27/42 (2006.01)
(52) U.S. Cl. .......................................... 355/30; 355/53
(58) Field of Classification Search ................... 355/30, 355/53, 67–71; 359/850
See application file for complete search history.

(56) References Cited

U.S. PATENT DOCUMENTS 6,198,793 B1   3/2001  Schultz et al. ................. 378/34
6,268,904 B1 * 7/2001  Mori et al. ..................... 355/53
6,538,722 B2 * 3/2003  Matsumoto et al. ........... 355/53
6,840,640 B2   1/2005  Antoni et al. ................. 359/858
6,964,485 B2  11/2005  Singer et al. ................ 359/850
7,006,194 B2   2/2006  Sumiyoshi et al. ........... 355/30
2001/0026354 A1 10/2001 Aoki ............................ 355/30

(Continued)

FOREIGN PATENT DOCUMENTS

DE        19855157       11/1998

(Continued)

OTHER PUBLICATIONS

Ulrich et al. "Trends in Optical Design of Projection Lenses for UV-and EUV Lithography". Soft X-Ray and EUV Imaging Systems, W.M. Kaiser, R.H. Stulen (Eds.), Proceedings of SPIE, vol. 4146 (2000), pp. 13-24.

(Continued)

Primary Examiner—Henry Hung Nguyen
(74) Attorney, Agent, or Firm—Ohlandt, Greeley, Ruggiero & Perle L.L.P.

(57) ABSTRACT

There is provided an optical system including an optical element having a first used area and a second used area on which impinge rays of a light bundle, and a device for moving the optical element between a first position and a second position. The light bundle impinges on the first used area when the optical element is in the first position, and light bundle impinges on the second used area when the optical element is in the second position.

45 Claims, 4 Drawing Sheets

U.S. PATENT DOCUMENTS

| | | | |
|---|---|---|---|
| 2002/0056815 A1 | 5/2002 | Mann et al. | 250/492.2 |
| 2004/0169832 A1* | 9/2004 | Shimoda | 355/30 |
| 2006/0092392 A1 | 5/2006 | Sumiyoshi et al. | 355/30 |

FOREIGN PATENT DOCUMENTS

| | | |
|---|---|---|
| DE | 19905203 | 2/2000 |
| DE | 10020592 | 4/2000 |
| DE | 10037870 | 2/2002 |
| EP | 1202117 | 10/2000 |
| JP | 2003-303751 | 10/2003 |
| WO | WO9927568 | 6/1999 |
| WO | WO0109681 | 2/2001 |
| WO | WO01109681 | 2/2001 |

OTHER PUBLICATIONS

Antoni et al. "Illumination Optics Design for EUV-Lithography". Soft X-Ray and EUV Imaging System, W.M. Kaiser, R.H. Stulen (eds.), Proceedings of SPIE, vol. 4146 (2000), pp. 25-34.

Eggenstein et al. "Cleaning of Contaminated XUV-optics at Bessy IIα". Nuclear Instruments and Methods in Physics Research A 467-468 (2001), pp. 325-328.

U.S. Appl. No. 60/255,214, filed Dec. 13, 2000, Mann et al.

* cited by examiner

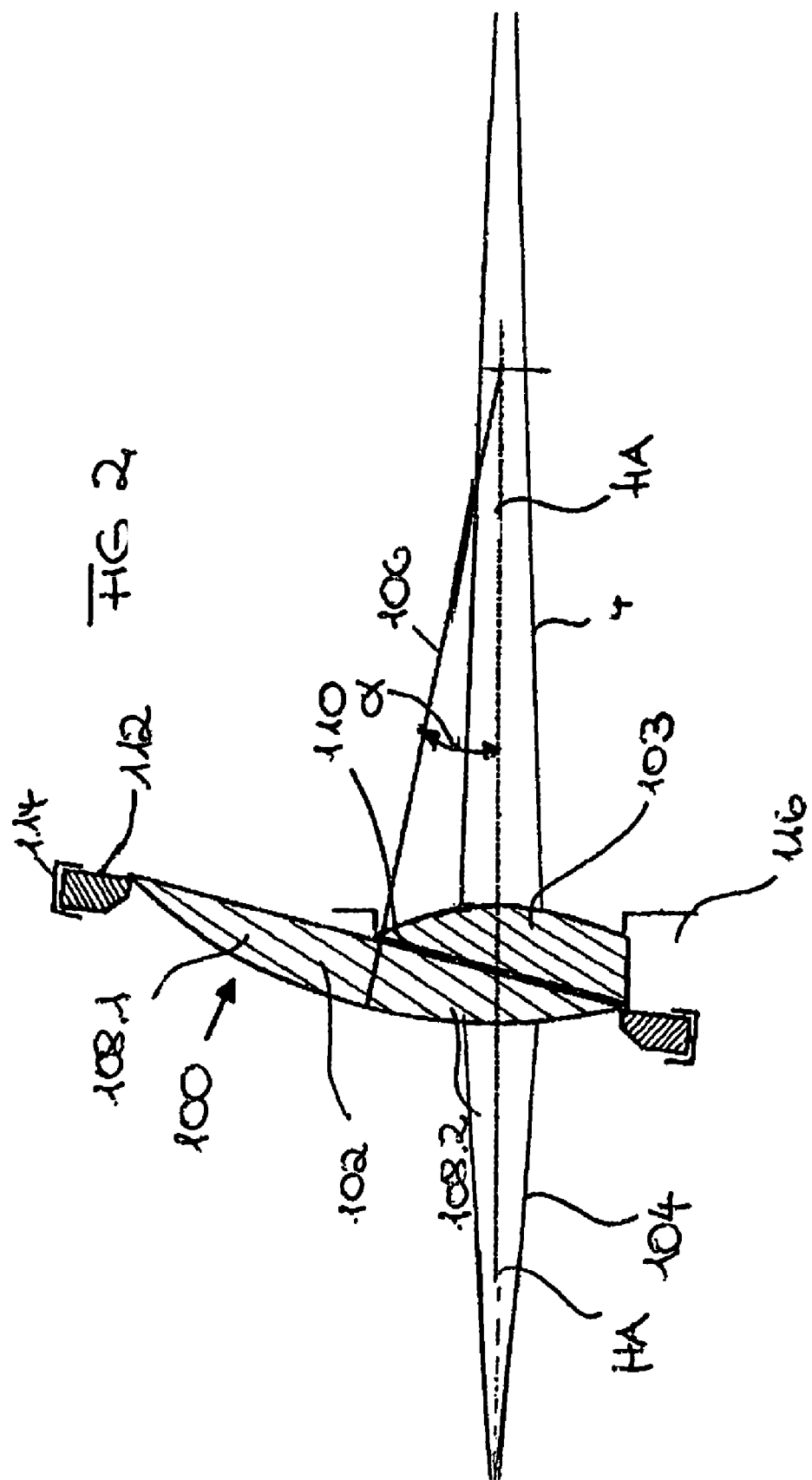

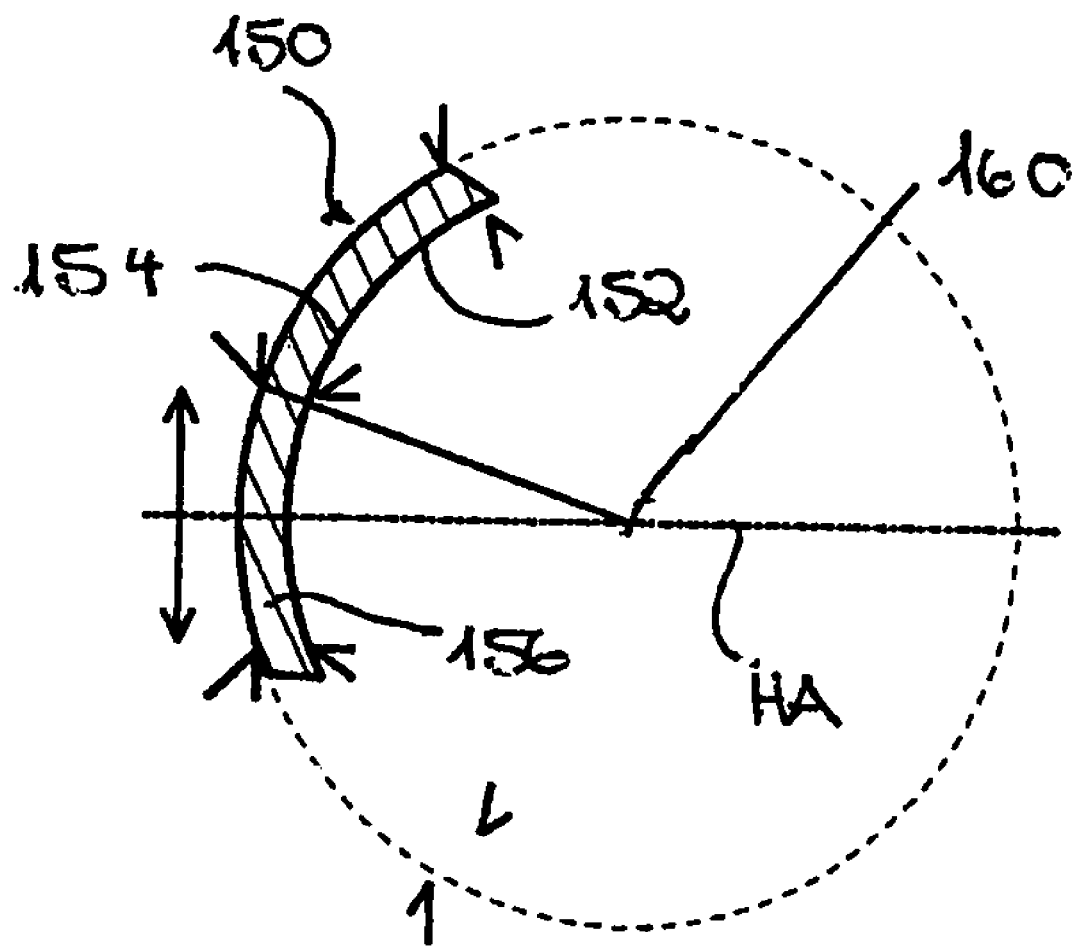

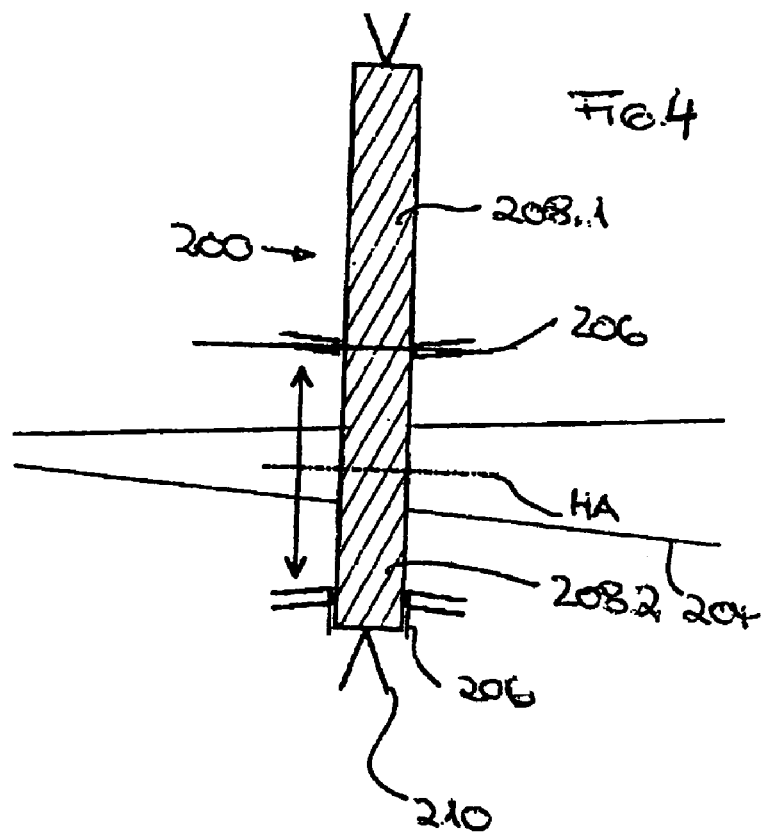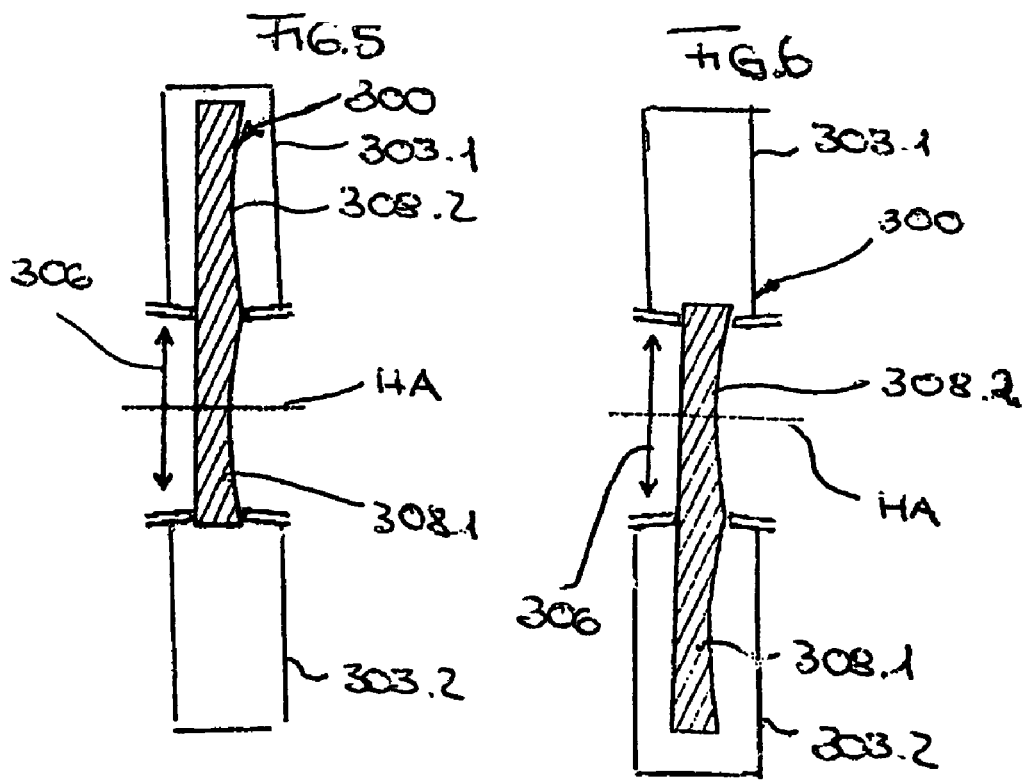

OPTICAL SYSTEM HAVING AN OPTICAL ELEMENT THAT CAN BE BROUGHT INTO AT LEAST TWO POSITIONS

CROSS-REFERENCE TO RELATED APPLICATIONS

The present application is a continuation of International Patent Application No. PCT/EP2003/005387, filed May 23, 2003, which claims priority of German Patent Application No. 102 40 002.4, filed Aug. 27, 2002, the content of which is herein incorporated by reference.

BACKGROUND OF THE INVENTION

1. Field of the Invention

The invention relates to an optical subsystem, in particular for a projection exposure system, wherein a light bundle passes through the subsystem and the optical subsystem has at least one optical element, on which the rays of the light bundle impinge on a first used area. Projection exposure systems for microlithography, in particular for wavelengths of ≦193 nm have become known from a plurality of applications. Relative to catadioptric systems, reference is made to DE-A-100 20 592; relative to refractive systems, reference is made to DE 198 55 157 and DE-A-199 05 203, the disclosure content of which is incorporated in its entirety in the present application. The field of the invention includes the field of projection exposure systems, in particular, those that operate with EUV radiation.

2. Description of the Related Art

At the present time, wavelengths in the range of 11–14 nm, in particular 13.5 nm, are discussed as wavelengths for EUV lithography, with a numerical aperture of 0.2–0.3. The image quality in EUV lithography is determined, on the one hand, by the projection objective, and on the other hand, by the illumination system. The illumination system will make available an illumination that is as uniform as possible in the field plane, in which the pattern-bearing mask, the so-called reticle, is disposed. The projection objective images the field plane in an image plane, the so-called wafer plane, in which a light-sensitive object is disposed. Projection exposure systems for EUV lithography are designed with reflective optical elements. The shape of the field in the image plane of an EUV projection exposure system is typically that of an annular field with a high aspect ratio of 2 mm (width)×22–26 mm (arc length). Projection systems are usually operated in scanning mode. With respect to EUV projection exposure systems, reference is made to the following publications:

W. Ulrich, S. Beiersdörfer, H. J. Mann, "Trends in Optical Design of Projection Lenses for UV- and EUV-Lithography" in Soft-X-Ray and EUV Imaging Systems, W. M. Kaiser, R. H. Stulen (Eds.), Proceedings of SPIE, Vol. 4146 (2000), pages 13–24 and M. Antoni, W. Singer, J. Schultz, J. Wangler. I. Escudero-Sanz, B. Kruizinga, "Illumination Optics Design for EUV-Lithography" in Soft X Ray and EUV Imaging Systems, W. M. Kaiser, R. H. Stulen (Eds.), Proceedings of SPIE, Vol. 4146 (2000), pages 25–34.

The disclosure content of the above publications is incorporated in its entirety in the present application.

In projection exposure systems, which operate at wavelengths of ≦193 nm, in particular, in the range of ≦157 nm, particularly in the EUV range with wavelengths of <30 nm, the problem arises that radiation in the EUV- or VUV and DU range, respectively, lead to a contamination and/or disruption of the optical surface of the components, which are also denoted optical elements.

The first and last optical surfaces, for example, of refractive systems are particularly at risk of contamination, since these are found in the direct vicinity, e.g., of a source, of a mask, or of a wafer to be exposed. Contaminants are introduced into the optical system by these surfaces. It is thus usual to protect these surfaces on either end, e.g., by a "skin", which comprises thin foils. Such foils, however, lead to absorption and, in addition, introduce aberrations into the optical system.

The high-energy radiation of the light sources of ≦193 nm leads to the fact that, for example, the residual oxygen components are converted into ozone by the radiation, which in turn attacks and can disrupt the surfaces of the optical elements and their coatings.

In addition, contaminations can be formed on the optical surface due to concentrations of residual gas, such as hydrocarbons from the atmosphere surrounding the optical surface, e.g., due to crystal formation or layers, e.g, of carbon or carbon compounds. Such contamination leads to a reduction in reflection in the case of reflective components and to a reduction in transmission in the case of transmissive components. The contamination may thus depend on the illumination intensity. In the case of EUV lithography, one may use sources, which emit a broadband spectrum. Even after a spectral filtering, e.g., with a grating spectral filter or a zirconium foil, a broad spectrum of high-energy radiation is present. Particularly high is the load in the first optical element up to the first multilayer mirror in an EUV system, since except for the radiation at, e.g., 13.5 nm, the broadband radiation of the source is present and thus the radiation load is maximal. In an EUV projection exposure system, the reflection is particularly reduced due to contamination in the case of the first optical element up to and including the first normal-incidence mirror in an illumination system for a projection exposure system. A normal-incidence mirror in this application is to be understood as a mirror on which the rays of the incident light bundle strike at an angle of <70° relative to the surface normal line.

The reflection loss on the first normal-incidence mirror is greatest in an illumination system of an EUV projection exposure system for this reason, since this mirror receives the highest power density of the light source, but essentially reflects only selectively at 13.5 nm, on account of the multiple layers. All other radiation which is emitted by the EUV source is thus converted into absorption power. Carbon or carbon compounds are again removed by regular cleaning of the mirror, for example, by means of admixtures of argon and oxygen under an RF plasma.

Relative to the cleaning of contaminated optics, reference is made to the following publication:

T. Eggenstein, F. Senf, T. Zeschke, W. Gudat, Cleaning of contaminated XUV-optics at Bessy II$^{\alpha}$, Nuclear Instruments and Methods in Physics Research A 467–468 (2001) p. 325–328, the disclosure content of which is incorporated in its entirety in the present application.

Such cleaning of the mirror is, of course, necessary at short time intervals. The useful operating time of the machine is thus very sharply reduced in this way. It may be necessary, for example, to repeatedly clean the first normal-incidence mirror in an EUV projection exposure system as often as approximately every 20 hours of operation. This cleaning lasts, for example, for approximately 2 hours, i.e., 10% of the use time.

SUMMARY OF THE INVENTION

The object of the invention is thus to offer an optical subsystem of a projection exposure system that is characterized in that the use times are increased in comparison to the devices known from the prior art. According to the invention, this is achieved by the fact that at least one optical element of the optical subsystem has a surface which is at least twice as large as the dimensions of the first used area on this optical element. By this measure, it can be achieved that an optical area on the mirror or a transmissive optical element can be regularly removed from the beam path in the optical subsystem and is cleaned, while a cleaned used area remains in the beam path. In this manner, it is possible to clean the contaminated optical elements regularly without interrupting the operating time of the machine.

It is particularly advantageous if the first used area and the used area(s) of the optical element have an identical optical effect. This is achieved in that the optical element is symmetric to a point of rotation, symmetric to an axis of rotation, or has several used areas with an identical optical effect, which are disposed along a translation axis, which is also denoted a displacement axis.

If the optical element has a point of rotation, then the optical element can be rotated around the point of rotation, in order to bring the different used areas with identical optical effect into the beam path.

As an alternative to a configuration symmetric to a point of rotation, the optical element can also be configured symmetric to an axis. The optical element then comprises an axis of rotation.

Such an optical element can be rotated around the axis of rotation in order to bring it from a first position into another position.

In another configuration of the invention, the optical element has a translation invariancy. In the case of such optical elements, the different optically identical regions can be brought into the beam path by displacement along an axis of translation, which is also denoted a displacement axis.

In a particularly advantageous embodiment, it is provided that the optical element is a reflective optical element, for example, a planar mirror, a spherical mirror, a grid, or an optical element with raster elements, wherein the raster elements are comprised of identical mirrors, in general a mirror with a behavior that is rotation- or translation-invariant.

In another embodiment, it is provided that the optical element is a transmissive optical element, for example, a filter element or a refractive optical element. Refractive optical elements can be, for example, a planar plate, a lens, or an optical element with raster elements, wherein the raster elements are comprised, e.g. of lenses, a beam splitter, or, in general, a refractive element with a rotation- or translation-invariant behavior.

In particular, in optical subsystems for EUV lithography, the optical element can be a reflective optical element, for example, a mirror with multiple layers, on which the rays of a light bundle impinge at angles $\alpha<70°$ in the used area. It would also be possible to use here a grazing-incidence mirror, on which the rays of the light bundle impinge at an angle $\alpha>70°$ relative to the surface normal line.

In a particular embodiment of the invention, the optical subsystem comprises a cleaning chamber. The cleaning chamber has an atmosphere separated, e.g., by vacuum technology, from the chamber, for example, the vacuum chamber of the rest of the optical subsystem. In the cleaning chamber that is separate from the remainder of the optical subsystem, a specific gas concentration can be introduced for purposes of cleaning, e.g., preferably an oxygen concentration and/or an argon concentration, or a flow of gas, as well as other means for cleaning, such as, for example, a UV light source, an RF antenna for generating a high-frequency plasma, electrodes for applying fields, or mechanical cleaning means. The mirror surface not in use is cleaned in one or another of the ways described above in the cleaning chamber.

In EUV lithographic systems, in addition to the formation of a separate vacuum chamber for cleaning purposes, it may also be provided that the optical element to be cleaned, in particular the optical mirror to be cleaned, is itself separated relative to the vacuum chamber of the rest of the system. An arrangement of the optical element to be cleaned in a separate vacuum chamber has the advantage that the mirror can be continually cleaned during operation by mixing in a specific oxygen concentration, and a full cleaning will be necessary only after longer operating times. Due to the arrangement in a separate vacuum chamber, the remainder of the system is protected, for example, from possible harmful effects of the cleaning. The optical subsystem is preferably an illumination system of a projection exposure system, but it can also be the projection objective itself, in which one or more optical elements according to the invention are formed, so that they allow a simple cleaning without interrupting operation.

In addition to the optical subsystem, the invention also provides a projection exposure system for EUV lithography with such an optical subsystem as well as a method for the production of microelectronic components. The invention will be described below on the basis of the figures.

BRIEF DESCRIPTION OF THE DRAWINGS

FIG. 2 shows an optical element according to the invention with a first half being used and a second half introduced into a cleaning position FIG. 3 shows a mirror or refractive lens consisting of a concentric meniscus and a curvature midpoint FIG. 4 shows a transmissive planar plate with first and second halves FIGS. 5, 6 show a transmissive plano-convex lens with first and second halves.

DESCRIPTION OF THE INVENTION

Figure 1:
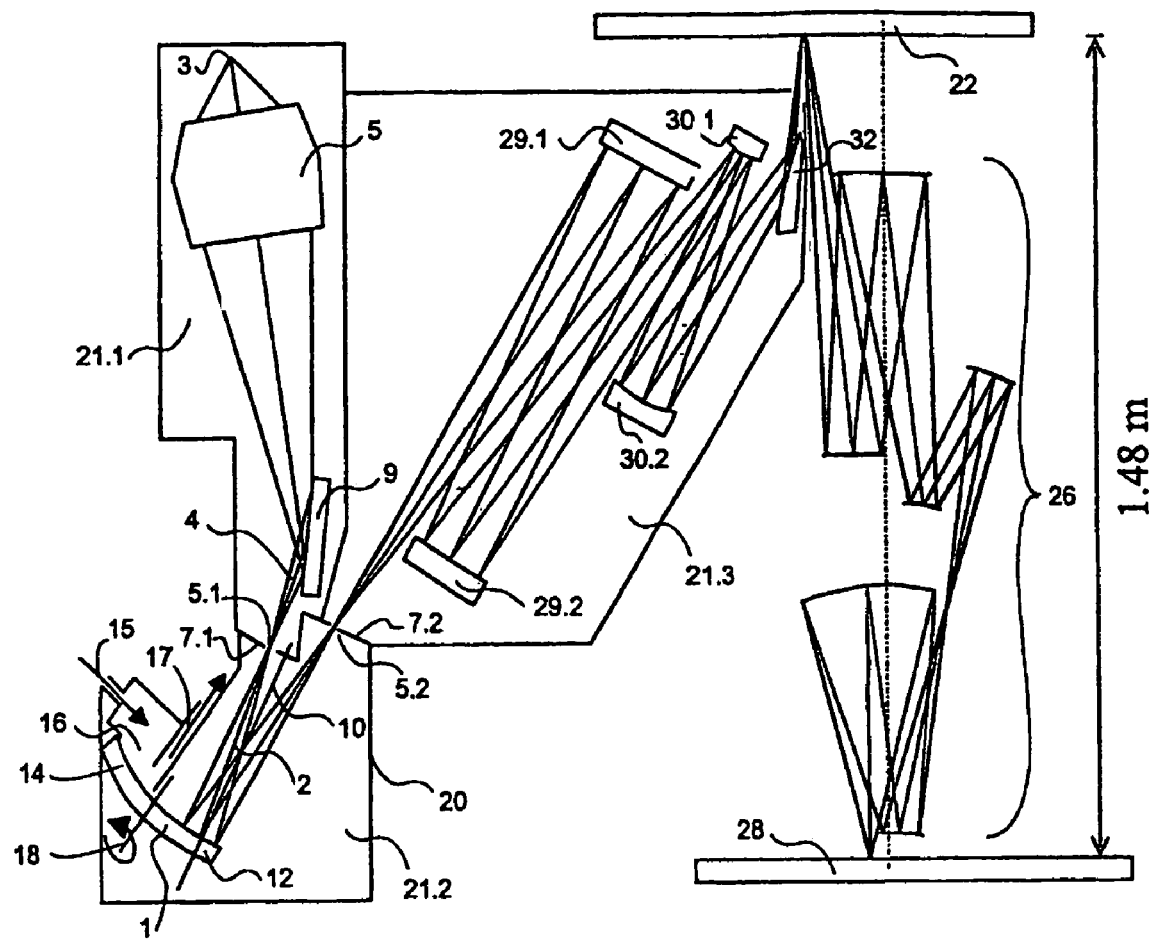
FIG. 1 shows a projection exposure system according to the invention, wherein the illumination system is designed as the first optical subsystem according to the invention

FIG. 1 shows an EUV projection exposure system with an optical element 1 according to the invention. The optical element 1 is a normal-incidence mirror, onto which rays 2 of a light bundle 4 from light source 3 to field plane 22 impinge at angles $\alpha<70°$ to the surface normal line in a first used area 12.

The dimensions of the optical element 1, here the normal incidence mirror, as can be seen from FIG. 1, are essentially larger than the first used area 12 of the mirror. The second used area 14 of the mirror is transported into a cleaning chamber 16 and is cleaned presently and not used.

Transport into the cleaning chamber 16 is conducted in the present case by turning around the axis of rotation 18. Other possibilities are also conceivable for transport into the cleaning chamber without departing from the basic concept of the invention. Such possibilities include the lateral transport of planar optical elements or the rolling, e.g., of spherical mirrors or concentric menisci.

As is clearly seen in FIG. 1, the cleaning chamber 16 is largely separated by vacuum technology from the vacuum chamber of the remainder of the illumination system. The cleaning chamber comprises an inlet line 15 for supplying a cleaning gas for cleaning the contaminated surface as well as an outlet channel 17. The cleaning gas preferably involves oxygen and/or argon. Further, additional and/or alternative means for cleaning, such as, for example, a UV light source, an RF antenna for generation of a high-frequency plasma or electrodes for applying an electrical voltage can be found in cleaning chamber 16. These additional or alternative means are not shown in FIG. 1. If all contaminations are removed from the mirror surface of the second used area 14 of the optical element, then, by rotation around the axis of rotation 18, the mirror can again be brought into a position in which the cleaned surface is used and the now contaminated surface in the first used area will be cleaned.

The EUV projection exposure system comprises in addition a light source 3, a collecting optical element, a so-called collector 5, which is formed as a nested collector. The collector 5 images the light source 3 lying in the object plane of the illumination system via an optional planar mirror 9, which additionally bends the beam path into a secondary light source 5.1 in or in the vicinity of a diaphragm plane 7.1.

In the embodiment shown the light source 3, which can be, for example, a laser-plasma source or a plasma discharge source, is disposed in the object plane of the illumination system of the projection exposure system.

The planar mirror 9 can alternatively be designed, e.g., as a grating spectral filter. The grating spectral filter together with the physical diaphragm 7.1 blocks the light of undesired wavelengths, in particular wavelengths longer than 30 nm. For example, the focal point of the −1 order comes to lie in the plane of the diaphragm 7.1, i.e., the light source 3 is imaged by collector 5 and grating spectral filter 9 in the −1 diffraction order nearly stigmatically in the plane of diaphragm 7.1. The imaging in all other diffraction orders is not stigmatic. The use of a grating spectral filter is shown in the present embodiment, and this is of advantage, since radiation in the wavelength region of >30 nm can be filtered thereby, but it is in no way absolutely necessary.

Thus an arrangement would also be conceivable, in which the grating spectral filter 9 is designed only as a planar mirror or is completely absent. It can also be clearly recognized that the entire vacuum chamber 20 of the illumination system is subdivided into three individual chambers. The light source, the collector and the grating spectral filter are disposed in a first vacuum chamber 21.1. Only the used area 12 that is in use of the optical element 1 is disposed in the second vacuum chamber 21.2. The optical elements of the illumination system that serve for the shaping and illumination of the field in the field plane 22 with an annular field are disposed in the third vacuum chamber 21.3. The separation of the individual vacuum chambers 21.1, 21.2, 21.3 is undertaken each time by means of differential pumping segments at the two intermediate images 5.1 and 5.2 of the light source 3. Such a separation of the illumination system into three vacuum chambers has the advantage that, by a separation of the optical element 1 to be cleaned into a separate vacuum chamber 21.2 and by adding, for example, a mixture of an oxygen concentration and an argon concentration in the vacuum chamber 21.2, a continual cleaning of the used area 12 in use of the first mirror 1 can be achieved during operation. In this manner, the service life can be clearly prolonged. Such a subdivision of the vacuum chamber of the illumination system is advantageous, but in no way necessary for the invention, however.

In addition, the illumination system of the projection system comprises an optical system for shaping and illuminating the field plane 22 with an annular field. As a mixing unit for the homogeneous illumination of the field, the optical system comprises two facet mirrors 29.1, 29.2 as well as two imaging mirrors 30.1, 30.2 and one field-forming, grazing-incidence mirror 32.

The first facet mirror 29.1, the so-called field facet mirror, produces a plurality of secondary light sources in or in the vicinity of the plane of the second facet mirror 29.2, the so-called pupil facet mirror. The following imaging optics images the pupil facet mirror 29.2 in the exit pupil of the illumination system, which comes to lie in the entrance pupil of the projection objective 26. The angles of inclination of the individual facets of the first and second facet mirrors 29.1, 29.2 are designed in such a way that the images of the individual field facets of the first facet mirror 29.1 are superimposed in the field plane 22 of the illumination system and thus a largely homogenized illumination of the pattern-bearing mask, which comes to lie in this field plane 22 is made possible. The segment of the annular field is formed via the field-forming, grazing-incidence mirror 32 operating under grazing incidence.

A double-faceted illumination system is disclosed, for example in U.S. Pat. No. 6,198,793, imaging and field-forming components are disclosed in PCT Publication No. WO 01/09681 and U.S. Pat. No. 6,840,640. The disclosure content of these documents is incorporated in its entirety in the present application.

The pattern-bearing mask, which is also denoted the reticle and is disposed in the field plane 22, is imaged by means of a projection objective 26 in the image plane 28 of the field plane 22. The projection objective 26 is a 6-mirror projection objective, such as disclosed, for example, in U.S. Patent Application No. 2002-0056815, the disclosure content of which is incorporated in its entirety in the present application. The object to be exposed, for example, a wafer, is disposed in image plane 28.

Although the embodiment shows as the optical element a normal-incidence mirror in an illumination system by way of example, the invention is in no way limited thereto. Of course, any other optical element in the illumination system or even in the projection objective can be cleaned in the manner according to the invention, by selecting the mirrors essentially larger than the used areas and moving the areas not in use into cleaning chambers for cleaning. The invention can also be transferred to purely refractive systems, for example, projection exposure systems for 157 nm.

Examples are illustrated in FIGS. 2 to 6, which can also be applied to reflective optical elements according to the invention.

FIG. 2 shows an example of embodiment of a lens 100, which is part of a refractively designed optical subsystem according to the invention in section. The lens 100 is subdivided into a first lens half 102 and a second lens half 103. The first lens half 102 is essentially larger than the second lens half 103. The first lens half 102 is designed so it can rotate around an axis of rotation 106. By rotating around this axis of rotation 106, the first used area 108.1 of the first lens half 102 can be moved out of the cleaning position into the position of use and the second used area 108.2 can be moved out of the position of use and into the cleaning position and vice versa. In the area of use, the rays of the light bundle 104, which pass through the optical subsystem, impinge on the refractive optical element, here the lens. The division of the lens into first and second lens halves is made by a wedge along the separation line 110. Due to the wedge-shaped separation, the axis of rotation 106 corresponds to the first lens half 102 with wedge over the wedge angle, and not with the [principal] optical axis HA of lens 100, which is comprised of first and second lens halves 102, 103. The axis of rotation 106 passes through the first lens half advantageously above the area of use of the first lens half.

In the cleaning position, the used area that is to be cleaned and that is part of the first lens half 102 is found in a cleaning device, which is not shown and which can be formed, for example, as a cleaning chamber. The contaminants that arise due to the loading of the lens in this used area, such as, e.g., crystal formation, are removed by means of the introduction of reactive gases and/or irradiation or by other means such as mechanical cleaning, in the cleaning device. If need be, a new coating can also be applied or a desired coating can be reactivated or repaired.

The first lens half 102 is held in a rotatable first holder 112. The rotatable first holder 112 is introduced in a guide 114. The second lens half 104 is held in a rigid second holder 116. A person skilled in the art can transfer the teaching given for refractive systems to reflective systems without inventive step, and vice versa, can transfer the teaching for reflective systems to refractive systems. Although not explicitly described for each individual case, these teachings are included in the scope of protection of the application.

FIG. 3 shows as a further example of an embodiment of the invention including an optical element that has a center of rotation. Such a component is given, for example, by a concentric meniscus 150. The concentric meniscus 150 comprises two used areas: a first used area 154 and a second used area 156. The optical axis of the area in use each time, that is, the area which is brought into the beam path, here the first used area 156, is denoted HA. The concentric meniscus is constructed symmetrically to a common midpoint of curvature, the so-called point of rotation 160.

The respective used area can be brought into the beam path, and/or can be taken out of the beam path and brought into the cleaning chamber, by rotating around this point of rotation 160.

FIG. 4 shows an embodiment including a transmissive planar plate 200, which can be rotated into a cleaning device and rotated out from it. The planar plate 200 comprises two used areas, a first used area 208.1 and a second used area 208.2. In the present FIG. 4, the first used area 208.1 is found in the cleaning device and the second used area 208.2 is found in the beam path of the rays of the light bundle 204, i.e., in the area of use of the planar plate. The axis of rotation 206 of the planar plate 200 is displaced parallel opposite the optical axis HA. The planar plate is held in a rotatable holder, which runs in a guide 210.

FIGS. 5 and 6 show an example of a transmissive plano-convex lens 300 with a first used area 308.1 and a second used area 308.2, another possibility for introducing the respective used areas into a cleaning device. This arrangement of several used areas operating in an optically identical manner is then a particularly advantageous embodiment of the invention, if the optical surfaces themselves do not possess a geometric shape invariant to rotation or translation. The arrangement of several optical elements next to one another along a displacement axis 306 makes it possible to achieve a translation invariancy for the optical element, independent of whether the optical surfaces of the optical element itself possess a rotation- or translation-invariant geometric shape. The transport according to FIGS. 5 and 6 is thus not necessarily achieved by a rotation around an axis of rotation, but, for example, also by a displacement along a displacement axis 306. In FIG. 5, the first used area 308.1 of the piano-convex lens 300 is brought into the optical area of use, i.e., the area, in which the rays of the light bundle impinge. The first used area 308.1 is centered relative to the optical axis HA. The second used area 308.2 is found in the cleaning position in a first cleaning device 303.1. Now, if the first used area 308.1 is to be cleaned, then the plano-convex lens 300 is moved along the displacement axis 306. This is shown in FIG. 6. The displacement axis 306 stands perpendicular to the optical axis HA. As can be recognized in FIGS. 5 and 6, a second cleaning device 303.2 is necessary for cleaning the first used area 308.1. When the first used area 308.1 is cleaned in the second cleaning device 303.2, the second used area 308.2 of the plano-convex lens is found in the area of use, i.e., in the area in which the rays of a light bundle impinge onto the optical element.

With the invention, for the first time, an optical subsystem is provided for a projection exposure system, with which it is possible to clean optical elements without shutting down the unit.

The invention claimed is:

1. A projection exposure system for microlithography comprising:
   an optical element having a first reflective area and a second reflective area, wherein said optical element is situated in a beam path of a light bundle that propagates, during operation of said projection exposure system, from a light source to an image plane; and
   a device for moving said optical element between a first position and a second position during operation of said projection exposure system,
   wherein, in said first position, said light bundle impinges onto said first reflective area and said second reflective area is in a cleaning position away from said beam path, and
   wherein, in said second position, said light bundle impinges onto said second reflective area and said first reflective area is in a cleaning position away from said beam path.

2. The system according to claim 1, wherein said optical element is part of an illumination system of said projection exposure system for microlithography.

3. The system according to claim 1, wherein said optical element is part of a projection objective of said projection exposure system for microlithography.

4. The system according to claim 1, wherein said first reflective area and said second reflective area have an identical optical effect.

5. The system according to claim 4, wherein said optical element is symmetric to a point of rotation.

6. The system according to claim 5, wherein said optical element can be rotated around said point of rotation to move said optical element between said first position and said second position.

7. The system according to claim 3, wherein said optical element is symmetric to an axis of rotation.

8. The system according to claim 7, wherein said optical element can be rotated around said axis of rotation to move said optical element between said first position and said second position.

9. The system according to claim 8, wherein said axis of rotation passes through a point on a surface of said optical element that lies outside said first reflective area and said second reflective area.

10. The system according to claim 4, wherein said optical element is divided into said first reflective area and said second reflective area along a displacement axis.

11. The system according to claim 10, wherein said optical element is moved along said displacement axis to move said optical element between said first position and said second position.

12. The system according to claim 1, wherein said first reflective area and said second reflective area are bounded by planar surfaces.

13. The system according to claim 1, wherein said optical element is a refractive optical element.

14. The system according to claim 13, wherein said refractive optical element is a lens with refractive power, wherein said lens is divided by a wedge relative to a lens axis into a first lens half and a second lens half, and wherein said first reflective area and said second reflective area are formed in said first lens half.

15. The system according to claim 14, wherein said first reflective area and said second reflective area are symmetric to an axis of rotation, wherein said axis of rotation has a wedge angle $\alpha$ with said lens axis, and wherein said axis of rotation intersects said first lens half outside said first reflective area and said second reflective area.

16. The system according to claim 15, wherein said first lens half can be turned around said axis of rotation to move said first lens half between said first position and said second position.

17. The system according to claim 1, wherein said optical element is a reflective optical element.

18. The system according to claim 17, wherein said reflective component is a mirror, wherein said mirror has an axis of rotation, and wherein said first reflective area and said second reflective area are symmetric to said axis of rotation.

19. The system according to claim 18, wherein said axis of rotation intersects a surface of said mirror outside said first reflective area and said second reflective area.

20. The system according to claim 19, wherein said mirror can be turned around said axis of rotation to move said mirror between said first position and said second position.

21. The system according to claim 17, wherein said system is designed for wavelengths of $\leq 193$ nm, wherein said optical element is a mirror having a multi-layer system, and wherein said rays impinge on said mirror at angles $\alpha$ of $<70°$ relative to a surface normal line of said first reflective area and said second reflective area.

22. The system according to claim 17, wherein said system is designed for wavelengths of $\leq 193$ nm, wherein said optical element is a grazing-incidence mirror, and wherein said rays impinge on said mirror at angles $\alpha$ of $70°$ relative to a surface normal line of said first reflective area and said second reflective area.

23. The system according to claim 1, further comprising a cleaning chamber into which an unused area of said optical element can be introduced, wherein said unused area is a portion of said optical element on which said light bundle does not impinge.

24. The system according to claim 23, further comprising a chamber that encloses said microlithography exposure system, wherein said cleaning chamber is separate from said chamber that encloses said microlithography exposure system.

25. The system according to claim 24, wherein said cleaning chamber is a vacuum chamber that is separated by vacuum technology from said chamber that encloses said microlithography exposure system.

26. The system according to claim 23, further comprising a gas inlet for introducing cleaning gases and/or other cleaning devices to said cleaning chamber.

27. The system according to claim 1, wherein said optical system an illumination system of a projection exposure system, wherein said optical element is part of a collector unit, wherein said collector unit comprises another optical element having a mirror dish, and wherein said rays impinge on said mirror dish at an angle of incidence of $<20°$ relative to a surface tangent of said mirror dish.

28. The system according to claim 1, wherein said optical system is an illumination system of a projection exposure system, wherein said optical element is a first optical element in a beam path from a light source to a field plane, and wherein said rays impinge on said optical element at angles of $<70°$ relative to a surface normal line of said optical element.

29. The system according to claim 1, wherein said optical element is part of an illumination system, and wherein said optical element is further part of a collector unit that includes additional optical elements.

30. A projection exposure system according to claim 1, further comprising:
an illumination system for illuminating a field in a field plane;
a carrier for a pattern-bearing mask disposed in a region of said field;
a projection objective; and
a carrier for a light-sensitive object,
wherein said pattern-bearing mask is imaged from said projection objective onto said light-sensitive object.

31. A method for the production of microelectronic components comprising affecting an object with a projection exposure system according to claim 30.

32. A projection exposure system for microlithography comprising:
an optical element having a surface that includes a first reflective region and a second reflective region;
a beam path for a light bundle that propagates, during operation of said projection exposure system, from a light source to an image plane; and
a device that moves said optical element to position said first reflective region in said beam path and said second reflective region in a cleaning position away from said beam path.

33. The projection exposure system according to claim 32, further comprising a cleaning chamber, wherein said cleaning position is in said cleaning chamber.

34. The projection exposure system according to claim 33,
wherein said cleaning chamber is a first chamber,
wherein said projection exposure system further comprises a second chamber that encloses another component of said projection exposure system, and
wherein said first chamber is separate from said second chamber.

35. The projection exposure system according to claim 33,
wherein said cleaning chamber is a first chamber,
wherein said projection exposure system further comprises a second chamber that encloses another component of said projection system, and
wherein said first chamber is a vacuum chamber that is separated by vacuum technology from said second chamber.

36. The projection exposure system according to claim 33, further comprising a gas inlet for introducing a cleaning gas to said cleaning chamber.

37. The projection exposure system of claim 32, wherein said device also moves said optical element to position said first reflective region in said cleaning position and said second reflective region in said beam path.

38. A projection exposure system for microlithography comprising:
- an optical element having a surface that includes a first optical region and a second optical region;
- a beam path for a light bundle that propagates, during operation of said projection exposure system, from a light source to an image plane; and
- a device that moves said optical element to a position along an axis to place said first optical region in said beam path, and said second optical region in a cleaning area away from said beam path.

39. The projection exposure system of claim 38, further comprising a cleaning chamber, wherein said cleaning area is in said cleaning chamber.

40. The projection exposure system of claim 39,
wherein said cleaning chamber is a first chamber,
wherein said projection exposure system further comprises a second chamber that encloses another component of said projection exposure system, and
wherein said first chamber is separate from said second chamber.

41. The projection exposure system of claim 39,
wherein said cleaning chamber is a first chamber,
wherein said projection exposure system further comprises a second chamber that encloses another component of said projection exposure system, and
wherein said first chamber is separate from said second chamber by vacuum technology.

42. The projection exposure system according to claim 39, further comprising a gas inlet for introducing a cleaning gas to said cleaning chamber.

43. The projection exposure system of claim 38,
wherein said position is a first position,
wherein said cleaning area is a first cleaning area, and
wherein said device also moves said optical element to a second position along said optical axis to place said second optical region in said beam path, and said first optical region in a second cleaning area away from said beam path.

44. The projection exposure system of claim 38, wherein said first optical region comprises a reflective optical element.

45. The projection exposure system of claim 38, wherein said first optical region comprises a transmissive optical element.

* * * * *